United States Patent
Kanba

Patent Number: 6,058,156
Date of Patent: May 2, 2000

[54] SHIFT REGISTER DEVICE AND METHOD OF DRIVING THE SAME

[75] Inventor: Kohji Kanba, Tokyo, Japan

[73] Assignee: NEC Corporation, Tokyo, Japan

[21] Appl. No.: 09/081,654

[22] Filed: May 20, 1998

[30] Foreign Application Priority Data

May 29, 1997 [JP] Japan ................................ 9-140365

[51] Int. Cl.[7] .................................................. G11C 19/00
[52] U.S. Cl. .................................................. 377/78; 377/81
[58] Field of Search ........................................ 377/78, 81

[56] References Cited

U.S. PATENT DOCUMENTS 5,239,206  8/1993  Yanai ........................................ 377/79
5,574,896  11/1996 Li et al. ..................................... 377/75

FOREIGN PATENT DOCUMENTS 2-143999  6/1990  Japan .
5-314785  11/1993 Japan .
6-68691   3/1994  Japan .
7-29389   1/1995  Japan .

OTHER PUBLICATIONS

*Microelectronic Circuits*, Sedra et al. Oxford University Press p. 1099, 1998.

Primary Examiner—Margaret R. Wambach
Attorney, Agent, or Firm—Young & Thompson

[57] ABSTRACT

A race-free shift register device having a plurality of series-connected flip-flop circuits and latch circuits. By a delay circuit, the timing of a clock signal input to each individual flip-flop circuit is delayed with respect to the clock signal input to the associated latch circuit, so that the operating timing of the latch circuit is not delayed with respect to the operating timing of the flip-flop circuit, even if a skew happens to occur in the clock signal. The latch circuit therefore surely holds bit data output by the flip-flop circuit, so the bit data to be input to a preceding flip-flop circuit is prevented from being prematurely provided to a succeeding flip-flop circuit, thereby ensuring prevention of a race condition.

20 Claims, 6 Drawing Sheets

SHIFT REGISTER DEVICE AND METHOD OF DRIVING THE SAME

BACKGROUND OF THE INVENTION

1. Field of the Invention The present invention relates to a shift register device in which a plurality of data hold circuits are connected in series with each data hold circuit having a series-connected set of flip-flop and latch circuits.

2. Description of the Related Art

Shift register devices in which a plurality of flip-flop circuits are connected in series have currently been widely used. In such a shift register device, serial input data can be shifted without any data loss as the flip-flop circuits of every odd places and those of every even places operate reversely in logic.

With the above-mentioned structure, racing could occur partly due to a possible skew of a clock signal. As an attempt to solve this problem, a shift register device in which a plurality of latch circuits are added, one to the output terminal of each of plural series-connected flip-flop circuits, has been proposed by Japanese Patent Laid-Open Publication No. Hei 6-5090. This conventional shift register device will now be described with reference to FIGS. 4 and 5 of the accompanying drawings of the present specification.

Figure 4:
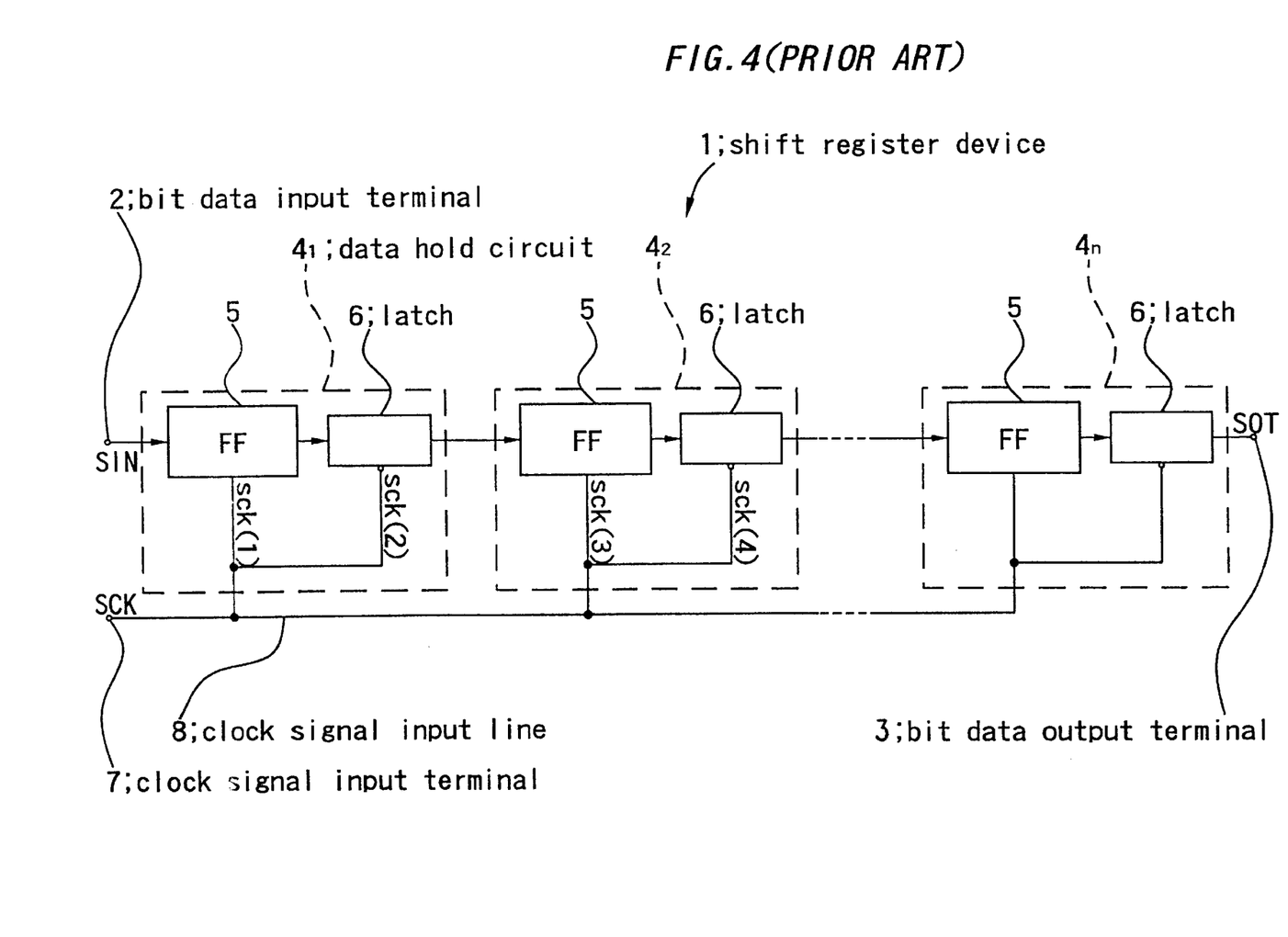
FIG. 4 is a block diagram of a conventional shift register device.

In the shift register device 1, as shown in FIG. 4, serial successive bit data are inputted from an input terminal 2 and transmitted to the right and outputted from an output terminal 3, and a plurality of data hold circuits 4 are arranged in series on a bit line communicating with the input and output terminals 2, 3. Each of the data hold circuits 4 consists of a flip-flop circuit 5 and a latch circuit 6 which are connected in series.

In the meantime, a clock signal is inputted to an input line 8 from an input terminal 7, the input line 8 being connected to the respective control terminals of the flip-flop and latch circuits 5, 6. The flip-flop and latch circuits 5, 6 operate in reverse logic in correspondence with the input clock signal between the data hold circuits 4 of every odd place and those of every even place.

Figure 5:
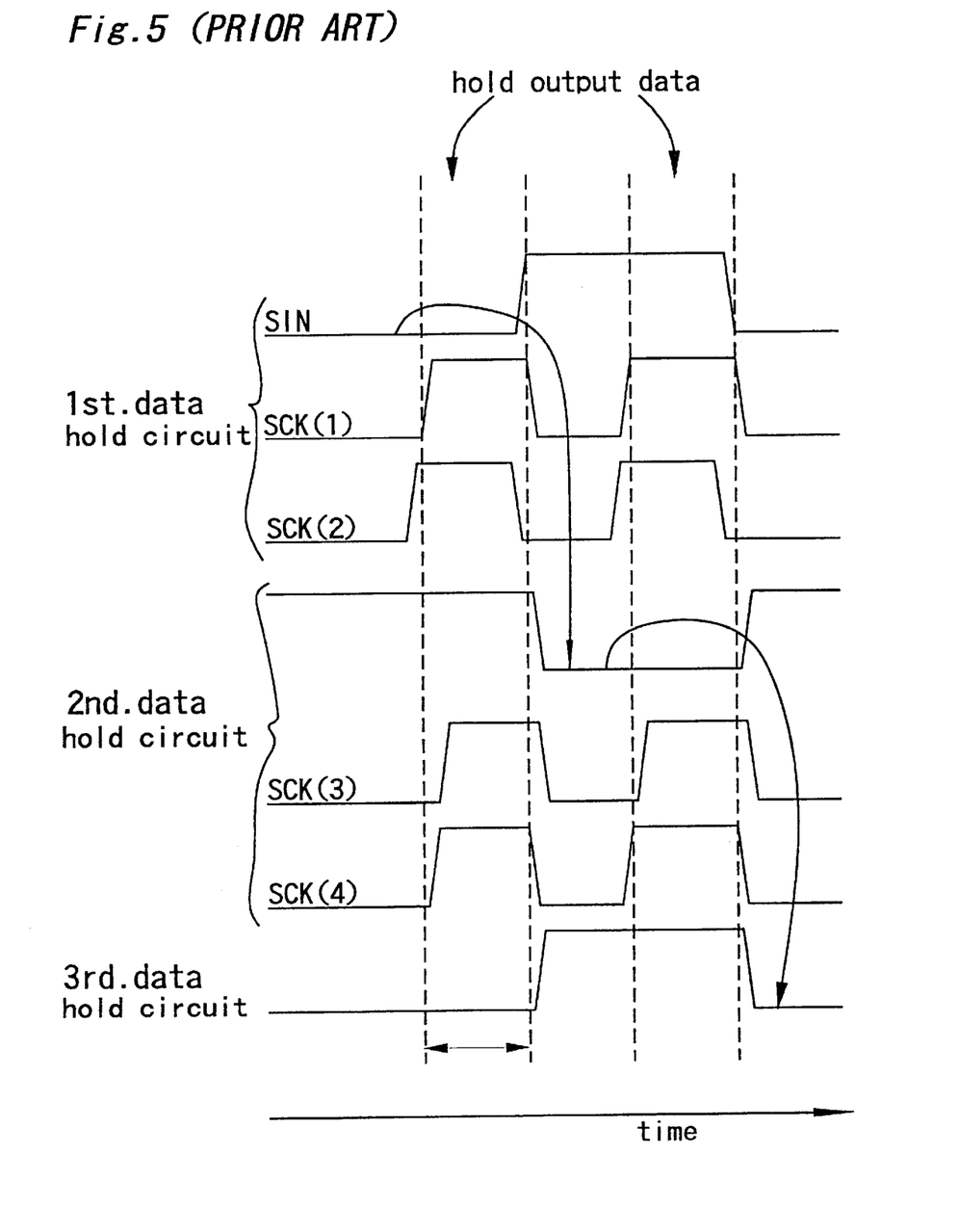
FIG. 5 is a time chart showing operating timings of various circuit elements of the conventional register device when the device is in normal operation.

Further, as shown in FIG. 5, the bit data outputted from the flip-flop circuit 5 of each (preceding) data hold circuit 4 in correspondence with the clock signal is held by the latch circuit 6, and the latch circuit 6 outputs this held bit data to the flip-flop circuit 5 of a succeeding data hold circuit 4.

Thus the bit data is temporarily held by every latch circuit 6 while it is shifted sequentially by the successive flip-flop circuits 5. Consequently, even when the input operation of the succeeding flip-flop circuit 5 is delayed with respect to the output operation of the preceding flip-flop circuit 5 resulting from a possible skew of the clock signal, this succeeding flip-flop circuit 5 can receive as an input the bit data held by the preceding latch circuit 6, which is associated with the preceding flip-flop 5. Namely, the so-called racing problem, in which the bit data input to the preceding flip-flop circuit 5 is prematurely provided to the succeeding flip-flop circuit 5 can be prevented in the absence of a possible skew of the clock signal between the flip-flop and latch circuits 5, 6.

Figure 6:
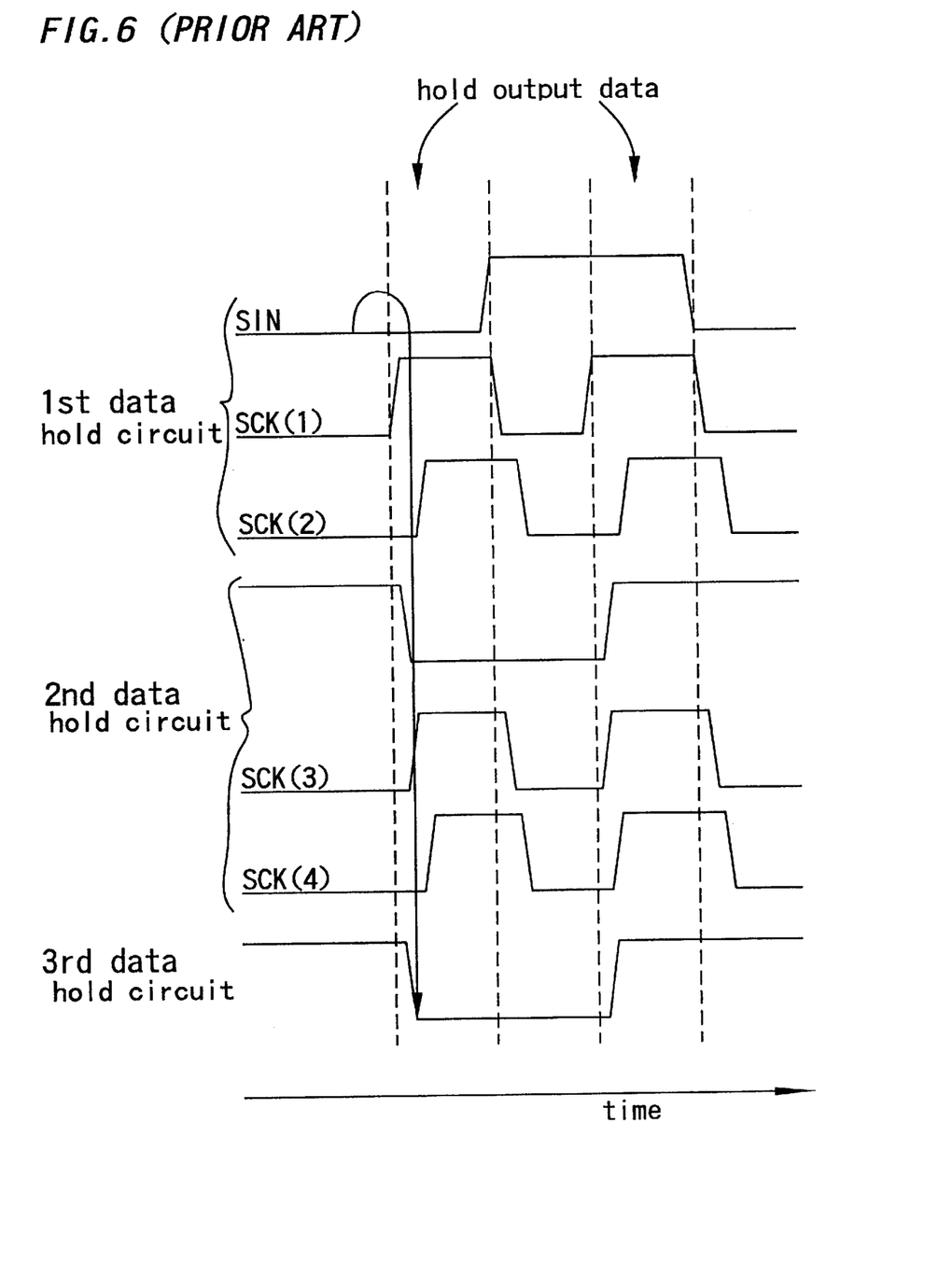
FIG. 6 is a time chart showing operating timings of various circuits elements of the conventional register device when racing has occurred in the device.

Practically, however, in this known shift register device 1, such a skew is not considered at all and, therefore, racing cannot completely be prevented. In other words, as shown in FIG. 6, if the clock signal, e.g. SCK (4), to be inputted to the latch circuit 6 is delayed with respect to that to be inputted to the flip-flop circuit 5 in the preceding data hold circuit 4, e.g. SCK (1), the bit data outputted from the flip-flop circuit 5 would happen to be outputted to the succeeding data hold circuit 4 without being held by the latch circuit 6 associated with the preceding flip-flop circuit 5.

At that time, if the input operation of the preceding flip-flop circuit 5 is yet delayed with respect to the output operation of the preceding flip-flop circuit 5, the bit data outputted to the succeeding flip-flop circuit 5 without being held by the preceding latch circuit 6 would happen to be outputted to the next to the succeeding data holding circuit 4 without being held by the last-named flip-flop circuit 5.

SUMMARY OF THE INVENTION

It is therefore an object of the present invention to provide a racing-free shift register device.

Another object of the invention is to provide a method of driving a racing-free shift register device.

According to a first aspect of the invention, the above first-named object is accomplished by a shift register device comprising: a bit data input line along which bit data is to be shifted from its input terminal toward its output terminal; a plurality of data hold circuits connected and arranged in series along the bit data input line; and a clock signal input line connected individually to the data hold circuits for sending input clock signals successively to the data hold circuits; each of the data hold circuits including a flip-flop circuit and a latch circuit which are connected in series; the flip-flop and latch circuits being operable in reverse logic in correspondence with the respective input clock signal between the data hold circuits of every odd place and those of every even place; each data hold circuit further including a time-delay circuit for delaying an operating timing of the flip-flop circuit with respect to that of the latch circuit.

In this first shift register device, since the time-delay circuit delays the operating timing of the flip-flop circuit of each data hold circuit with respect to that of the latch circuit of the same data hold circuit, the flip-flop circuit operates to output the bit data until after the latch circuit assumes a state ready to hold the bit data. Accordingly, the bit data outputted by the flip-flop circuit is surely held by the latch circuit in the same data hold circuit so that the bit data held by the latch circuit of the preceding data hold circuit is inputted to the flip-flop circuit of the succeeding data hold circuit even when the input timing of the flip-flop circuit of the succeeding data hold circuit is delayed with respect to the output timing of the flip-flop circuit of the preceding data hold circuit.

According to a second aspect of the invention, the first-named object is accomplished alternately by a shift register device as in the first aspect of the invention, further comprising the clock signal input line having a plurality of lead lines connected one to each of the data hold circuits, each of the lead lines having such a shape as to delay the preceding input clock signal, which renders the flip-flop circuit of each data hold circuit operative, with respect to the succeeding input clock signal, and thereby renders the latch circuit of the same data hold circuit operative.

In this second shift register device, the bit data held by the latch circuit of the preceding data hold circuit is inputted to the flip-flop circuit of the succeeding data hold circuit in a very simple structure, even when the input timing of the flip-flop circuit of the succeeding data hold circuit is delayed with respect to the output timing of the flip-flop circuit of the preceding data hold circuit.

According to a third aspect of the invention, the first-named object is accomplished alternately by the shift register device of the first aspect of the invention, wherein each data hold circuit further includes a signal-delay circuit for delaying the preceding input clock signal, which renders the flip-flop circuit of each data hold circuit operative, with respect to the succeeding input clock signal, and thereby renders the latch circuit of the same data hold circuit operative.

In this third shift register device, the flip-flop circuit operates to output the bit data until after the latch circuit assumes a state ready to hold the bit data. Accordingly, the bit data outputted by the flip-flop circuit is surely held by the latch circuit in the same data hold circuit so that the bit data held by the latch circuit of the preceding data hold circuit is inputted to the flip-flop circuit of the succeeding data hold circuit, even when the input timing of the flip-flop circuit of the succeeding data hold circuit is delayed with respect to the output timing of the flip-flop circuit of the preceding data hold circuit.

According to a fourth aspect of the invention, the first object is further accomplished alternatively by the shift register device of the first aspect of the invention, wherein each data hold circuit further includes a delay circuit for delaying the preceding clock signal to operate the flip-flop circuit with respect to the succeeding clock signal and thereby operating the latch circuit.

In this fourth shift register device, since the delay circuit operates to delay the operating timing of the flip-flop circuit of each data hold circuit with respect to those of the latch circuit of the same data hold circuit, the flip-flop circuit operates to output the bit data until after the latch circuit assumes a state ready to hold the bit data. Accordingly, the bit data outputted by the flip-flop circuit is surely held by the latch circuit in the same data hold circuit so that the bit data held by the latch circuit of the preceding data hold circuit is inputted to the flip-flop circuit of the succeeding data hold circuit, even when the input timing of the flip-flop circuit of the succeeding data hold circuit is delayed with respect to the output timing of the flip-flop circuit of the preceding data hold circuit.

According to a fifth aspect of the invention, the above second-named object is accomplished by a method of driving a shift register device, which includes a plurality of series-connected data hold circuits each having a series set of a flip-flop circuit and a latch circuit which are operable in reverse logic in correspondence with input clock signals between the data hold circuits of every odd place and those of every even place, wherein operating timing of the flip-flop circuit of each data hold circuit is delayed with respect to that of the latch circuit of the same data hold circuit.

In this first shift-register-device driving method, since the operating timing of the flip-flop circuit of each data hold circuit is delayed with respect to that of the latch circuit of the same data hold circuit, the flip-flop circuit operates to output the bit data until after the latch circuit assumes a state ready to hold the bit data. Accordingly, the bit data outputted by the flip-flop circuit can surely be held by the latch circuit, so that the bit data held by the latch circuit of the preceding data hold circuit can be inputted to the flip-flop circuit of the succeeding data hold circuit, even when the input timing of the flip-flop circuit of the succeeding data hold circuit is delayed with respect to the output timing of the flip-flop circuit of the preceding data hold circuit.

According to a sixth aspect of the invention, the second-named object is accomplished alternatively by a method of driving a shift register device as in the fifth aspect of the invention, wherein an input clock signal for operating the flip-flop circuit of each data hold circuit is delayed with respect to that for operating the latch circuit of the same data hold circuit.

In this second shift-register-device driving method, since the input clock signal for operating the flip-flop circuit of each data hold circuit is delayed with respect to that for operating the latch circuit of the same data hold circuit, the flip-flop circuit operates to output the bit data until after the latch circuit assumes a state ready to hold the bit data. Accordingly, the bit data outputted by the flip-flop circuit can surely be held by the latch circuit, so the bit data held by the latch circuit of the preceding data hold circuit can be inputted to the flip-flop circuit of the succeeding data hold circuit, even when the input timing of the flip-flop circuit of the succeeding data hold circuit is delayed with respect to the output timing of the flip-flop circuit of the preceding data hold circuit.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

The principles of the present invention are particularly useful when applied to a shift register device and a method of driving the shift register device, a couple of preferred embodiments of which will now be described with reference to FIGS. 1 and 2.

Figure 1:
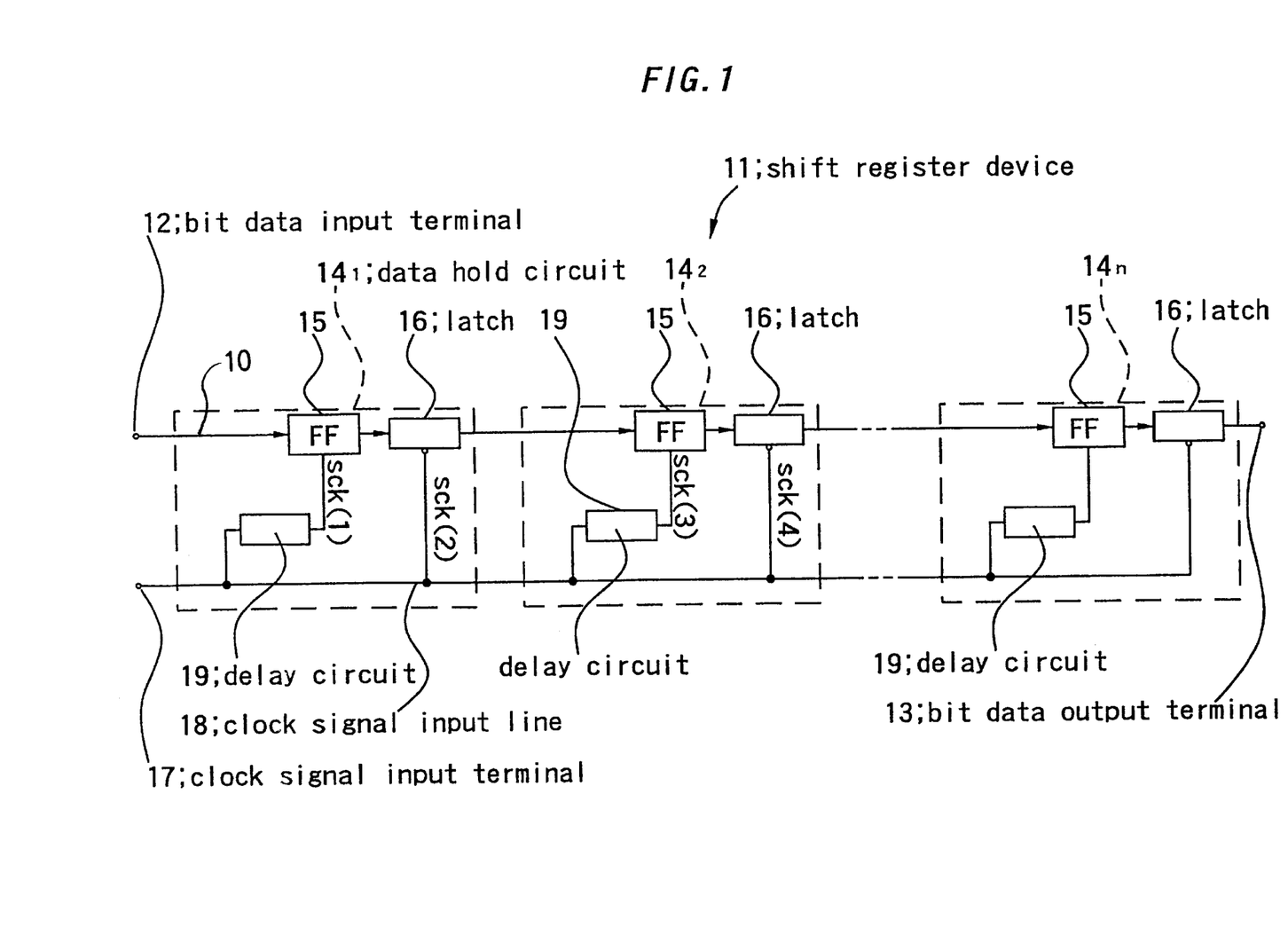
FIG. 1 is a block diagram of a shift register device according to a first embodiment of the present invention.
Figure 2:
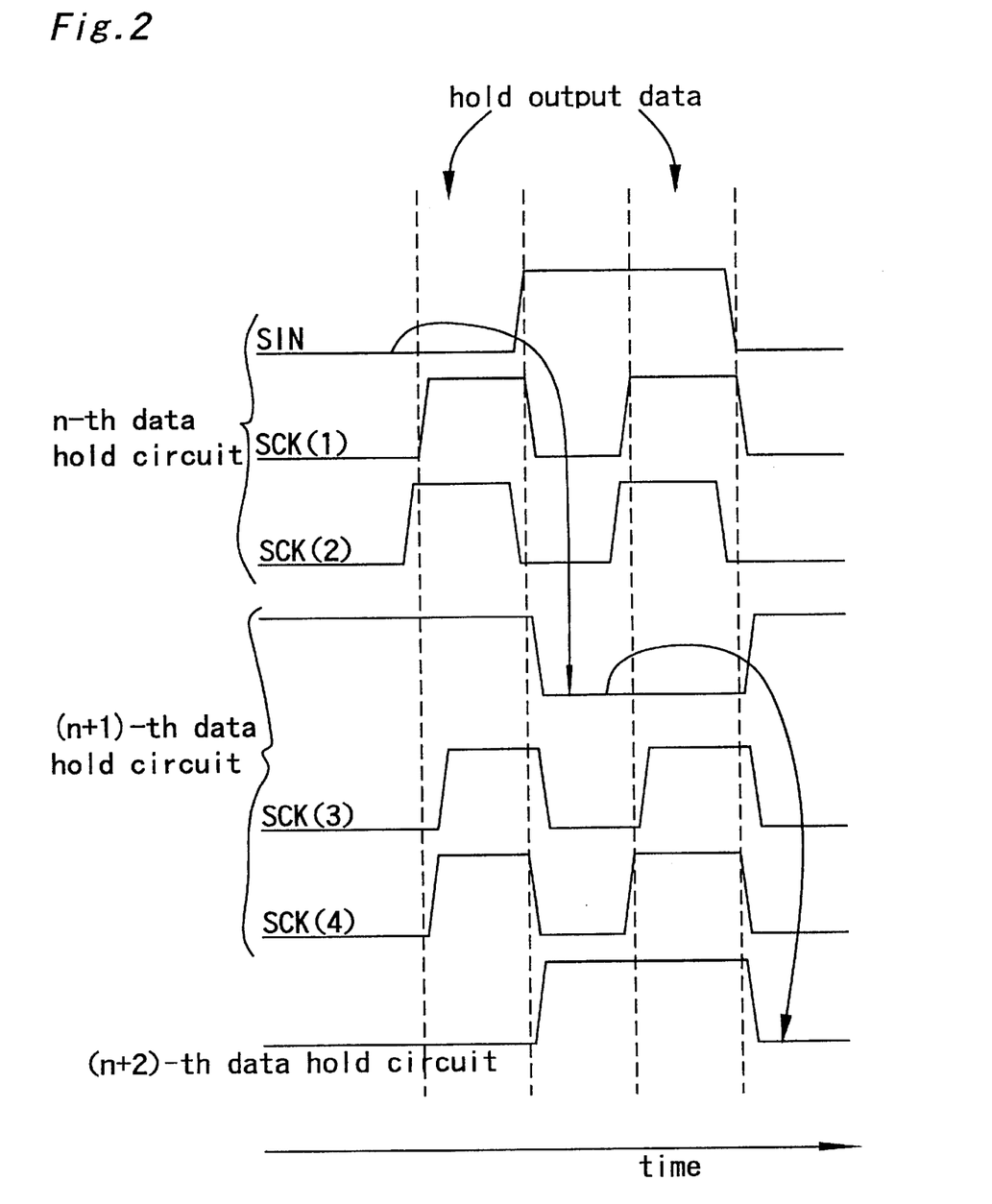
FIG. 2 is a time chart showing operating timings of various circuit elements of the shift register device of the first embodiment.

FIG. 1 is a block diagram of a shift register device, which is generally indicated by reference number 11, according to a first embodiment of the invention, and FIG. 2 is a time chart showing operating timings of various circuit elements of the shift register device of FIG. 1. In FIGS. 1 and 2, parts, elements or signals similar to those of the conventional art of FIGS. 3 to 6 are designated by the same reference numbers and/or labeled with the same names.

As shown in FIG. 1, this shift register device 11, like the conventional shift register device of FIG. 4, comprises a bit data input line 10 communicating with an input terminal 12 and an output terminal 13, and a plurality of data hold circuits $14_1, 14_2, \ldots 14_n$ (hereinafter also referred to simply 14) connected and arranged in series along the bit data input line 10.

Each of the data hold circuits 14 has a flip-flop circuit 15 and a latch circuit 16 which are connected in series. The shift register device 11 further comprises a clock signal input line 18 communicating with a clock-signal input terminal 17 and connected to individual control terminals of the flip-flop and latch circuits 15, 16 of every data hold circuit 14. The shift register device 11 is differentiated over the conventional shift register device of FIG. 4 in that each data hold circuit 14 additionally has a delay circuit 19, which is connected at its input to the clock signal input line 18 and at its output to the flip-flop circuit 15, for performing as an operation delaying means, and as a signal delaying means as described below.

In the shift register device 11 thus constructed, the bit data outputted from the flip-flop circuit 15 of each data hold circuit 14 in correspondence with an input clock signal is held by the latch circuit 16 of the same circuit 14, and then this held bit data is inputted to the flip-flop circuit 15 of the succeeding data hold circuit 14.

In driving the shift register device 11, as shown in FIGS. 1 and 2, a clock signal SCK (1) is inputted to the flip-flop circuit 15 of the data hold circuit $14_1$ of the first place from the clock-signal input line 18 via the associated delay circuit 19, while a clock signal SCK (2) is inputted to the latch circuit 16 of the same data hold circuit $14_1$ directly from the clock-signal input line 22. At that time, by the action of the associated delay circuit 19, the clock signal SCK (1), which renders the flip-flop circuit 15 of the first data hold circuit $14_1$ operative is delayed with respect to the clock signal SCK (2), which renders the latch circuit 16 of the same data hold circuit $14_1$ operative, by the associated delay circuit 19.

Accordingly, in an arbitrary (i.e. the n-th, where n stands for an arbitrary integer) data hold circuit $14_n$, since the flip-flop circuit 15 does not output bit data until after the latch circuit 16 assumes a state ready to hold the bit data, the bit data outputted from the flip-flop circuit 15 can surely be held by the latch circuit 16. Therefore, even if the input timing of the flip-flop circuit 15 of the succeeding data hold circuit $14_{n+1}$ is delayed with respect to the output timing of the flip-flop circuit 15 of the preceding data hold circuit $14_n$, it is possible to input to the flip-flop circuit 15 of the succeeding data hold circuit $14_{n+1}$, the bit data held by the latch circuit 16 of the preceding data hold circuit $14_n$.

In other words, in the shift register device 11, even when a skew occurs in the clock signal, the input operation of the latch circuit 16 does not delay with respect to the output operation of the flip-flop circuit 15 within the same or n-th data hold circuit $14_n$, so the bit data which has to be inputted to the flip-flop circuit 15 of the next data hold circuit $14_{n+1}$ can surely be prevented from being inputted prematurely to the flip-flop circuit 15 of the next following hold circuit $14_{n+2}$ so that racing can be avoided.

Figure 3:
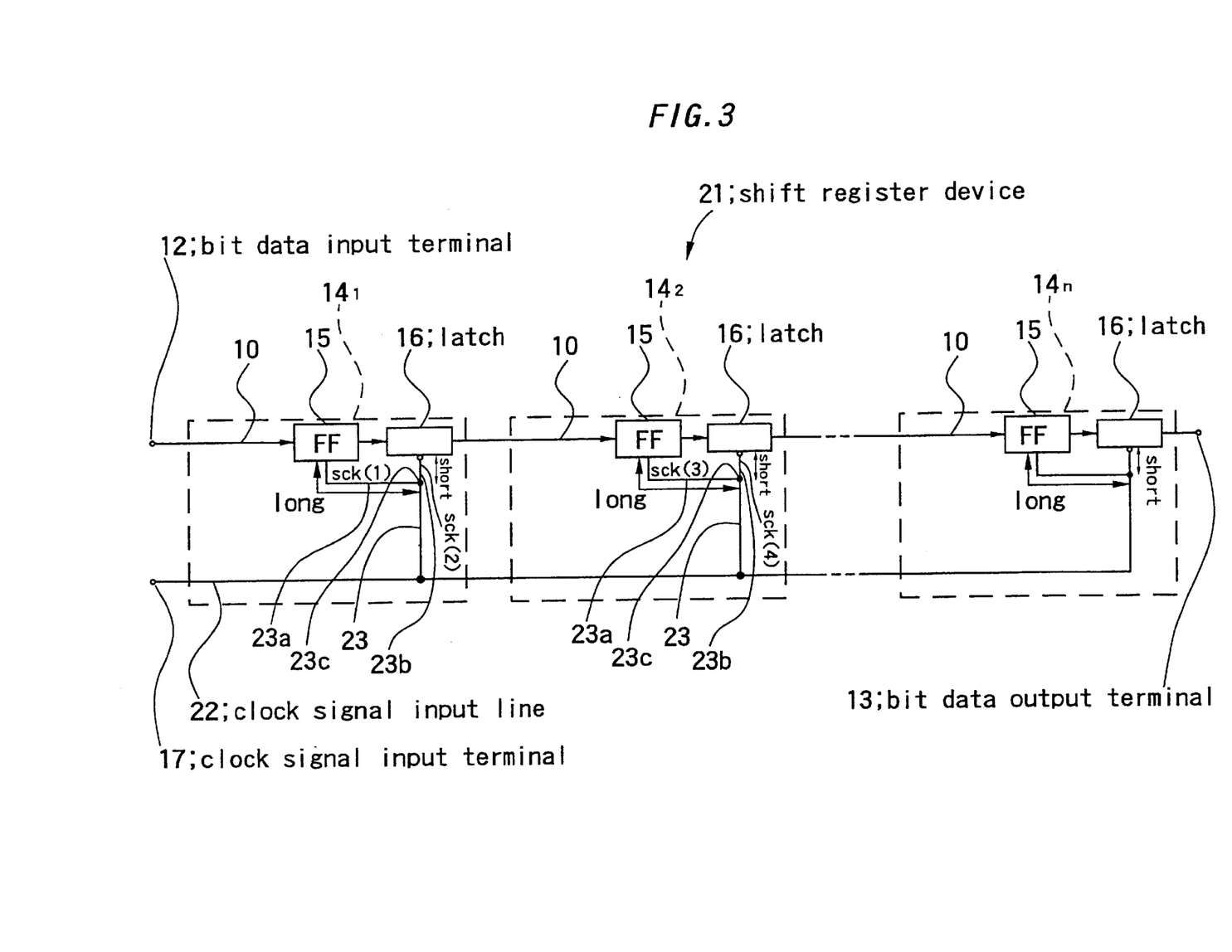
FIG. 3 is a block diagram of a modified shift register device according to a second embodiment of the invention.

FIG. 3 is a block diagram of a modified shift register device, which is generally indicated by reference number 21, according to a second embodiment of the invention. In FIG. 3, parts, elements or signals similar to those of the first embodiment of FIG. 1 are designated by the same reference numbers and/or labeled with the same names.

As shown in FIG. 3, this modified shift register device 21, like the shift register device 11 of the first embodiment of FIG. 1, comprises a bit data input line 10 communicating with an input terminal 12 and an output terminal 13, and a plurality of data hold circuits 14 connected and arranged in series along the bit data input line 10. Each of the data hold circuits 14 has a flip-flop circuit 15 and a latch circuit 16 which are connected in series.

The modified shift register device 21 is differentiated over the shift register device 11 of the first embodiment of FIG. 1 in that each data hold circuit 14 is devoid of the delay circuit 19, and has a bifurcated branch lead line 23 connected at one end to a clock-signal input line 22, and at the other end to the flip-flop and latch circuits 15, 16 for performing as the above-mentioned operation delaying means and signal delaying means.

Specifically the bifurcated branch lead line 23 extends from the clock-signal input line 22 to a junction 23c where the branch lead line 23 is divided into a first sub-branch portion 23a leading to the control terminal of the flip-flop circuit 15 and a second sub-branch portion 23b leading to the control terminal of the latch circuit 16. The first sub-branch portion 23a is longer than the second sub-branch portion 23b so that the input clock signal SCK (1) or SCK (3) (FIG. 2) from the clock-signal input line 22 takes a longer time to reach the flip-flop circuit 15 than the time the clock signal SCK (2) or SCK (4) (FIG. 2) takes to reach the latch circuit 16, thus delaying the operating timing of the flip-flop circuit 15 with respect to that of the latch circuit 16. Thus this bifurcated branch 23 may be regarded as an equivalent means to the delay circuit 19 of FIG. 1 in operation and result as well.

The foregoing embodiments have merits and demerits; the shift register device 11 using the delay circuits 19 (first embodiment of FIG. 1) operates more reliably, while the shift register device 21 utilizing the clock-signal input line 22 with the bifurcated branch lines 23 (second embodiment of FIG. 3) has a simpler structure. Practically, either shift register device may be selected as desired to meet various kinds of conditions such as demanded performance and production facilities.

According to the shift register device and shift-register-device driving method of the present invention, since the operating timing of the latch circuit of each data hold circuit does not delay with respect to the operating timing of the flip-flop circuit of the same data hold circuit, even when a skew occurs in the clock signal, the bit data outputted by the flip-flop circuit can surely be held by the latch circuit, so the bit data which the bit flip-flop circuit of the preceding data hold circuit can be prevented from being inputted prematurely jump to the flip-flop circuit of the succeeding data hold circuit so that racing can totally be avoided.

It is thus apparent that the present invention should by no means be limited to the illustrated embodiment, and various modifications and changes may be suggested without departing from the scope and spirit of the invention.

Finally, the present application claims the priority of Japanese Patent Application No. Hei 9-140365 filed on May 29, 1997, which is herein incorporated by reference.

What is claimed is:

1. A shift register device comprising:
a bit data input line along which bit data is to be shifted from an input terminal toward an output terminal;
a plurality of data hold circuits connected and arranged in series along said bit data input line between said input terminal and said output terminal; and
a clock signal input line connected individually to each of said plurality of data hold circuits for providing an input clock signal successively to said each of said plurality of data hold circuits;
said each of said plurality of data hold circuits including a flip-flop circuit and a latch circuit directly connected in series in the named order;
each of said plurality of data hold circuits further including a time-delay circuit having an input and an output designed and adapted to delay an operating timing of said flip-flop circuit with respect to an operating timing of said latch circuit, wherein said flip-flop circuit and said latch circuit are respectively enabled on alternate half-cycles of said clock input signal.

2. A shift register device according to claim 1, wherein said time-delay circuit of each of said plurality of data hold circuits is connected at said input to said clock signal input line and at said output to a control terminal of said flip-flop circuit.

3. A shift register device according to claim 1, wherein said clock signal input line is connected directly to a control terminal of said latch of each of said plurality of data hold circuits.

4. A shift register device comprising:
   a bit data input line along which bit data is to be shifted from an input terminal toward an output terminal;
   a plurality of data hold circuits connected and arranged in series along said bit data input line between said input terminal and said output terminal; and
   a clock signal input line connected individually to each of said plurality of data hold circuits for providing an input clock signal successively to said each of said plurality of data hold circuits;
   said each of said plurality of data hold circuits including a flip-flop circuit and a latch circuit directly connected in series in the named order;
   said flip-flop circuit and said latch circuit being enabled respectively on alternate half-cycles of said clock input signal;
   said clock signal input line comprising a plurality of lead lines connected one to each of said plurality of data hold circuits, each of said plurality of lead lines having a shape designed and adapted to delay said input clock signal and render said flip-flop circuit of each of said plurality of data hold circuits operative, wherein said latch circuit of the same data hold circuit is rendered operative by said input clock signal.

5. A shift register device according to claim 4, wherein each said lead line is a bifurcated branch line extending from said clock signal input line and terminating in a bifurcated end connected to a respective control terminal of each said data hold circuit.

6. A shift register device according to claim 5, wherein said bifurcated branch line extends from said clock signal input line to a junction and is divided at said junction into a first sub-branch portion leading to a control terminal of said flip-flop circuit and a second sub-branch portion leading to a control terminal of said latch circuit, said first sub-branch portion being longer than said second sub-branch portion.

7. A shift register device comprising:
   a bit data input line along which bit data is to be shifted from an input terminal toward an output terminal;
   a plurality of data hold circuits connected and arranged in series along said bit data input line between said input terminal and said output terminal; and
   a clock signal input line connected individually to each of said plurality of data hold circuits for providing an input clock signal successively to said each of said plurality of data hold circuits;
   said each of said plurality of data hold circuits including a flip-flop circuit and a latch circuit directly connected in series in the named order, wherein said flip-flop circuit and said latch circuit are respectively enabled on alternate half-cycles of said clock input signal;
   each of said plurality of data hold circuits further including a signal-delay circuit for delaying said input clock signal applied to said flip-flop circuit of each of said plurality of data hold circuits with respect to said input clock signal applied directly to corresponding said latch circuit of said plurality of data hold circuits.

8. A shift register device comprising:
   a bit data input line along which bit data is to be shifted from an input terminal toward an output terminal;
   a plurality of data hold circuits connected and arranged in series along said bit data input line between said input terminal and said output terminal; and
   a clock signal input line connected individually to each of said plurality of data hold circuits for providing an input clock signal successively to said each of said plurality of data hold circuits;
   said each of said plurality of data hold circuits including a flip-flop circuit and a latch circuit directly connected in series in the named order, wherein said flip-flop circuit and said latch circuit are respectively enabled on alternate half-cycles of said clock input signal;
   each of said plurality of data hold circuits further including a delay circuit for delaying said input clock signal applied to operate said flip-flop circuit with respect to said input clock signal applied to operate said latch circuit.

9. A method of driving a shift register device, which includes a plurality of series-connected data hold circuits, each having a series set of a flip-flop circuit and an associated latch circuit arranged in the named order which are respectively operable on alternate half-cycles of an input clock signal, comprising:
   delaying the operating timing of the flip-flop circuit of each data hold circuit with respect to the operating timing of the latch circuit of the same data hold circuit.

10. A method according to claim 9, further comprising the step of maintaining the output of the flip-flop circuit of each data hold circuit until after the latch circuit assumes a state ready to receive and hold the bit data of the same data hold circuit.

11. A method according to claim 9, further comprising the step of delaying the input timing of the flip-flop circuit of a succeeding data hold circuit with respect to the output timing of the flip-flop circuit of a preceding data hold circuit.

12. A method according to claim 9, wherein the latch circuit of a data hold circuit is rendered to output its holding bit data to the flip-flop circuit of the next series-connected data hold circuit when the input operation of the latch circuit is not delayed with respect to the output operation of the flip-flop circuit within the same data hold circuit.

13. A method according to claim 9, further comprising the step of:
   maintaining the output of the flip-flop circuit of each data hold circuit by a time-delay circuit until after the latch circuit assumes a state ready to receive and hold the bit data of the same data hold circuit,
   wherein the step of delaying the operating timing of the flip-flop circuit is accomplished by connecting a time-delay circuit to each data hold circuit so that each time-delay circuit input is connected to the clock signal input lines and each time-delay circuit output is connected to a control terminal of the flip-flop circuit, and wherein the clock signal input line is connected directly to a control terminal of the associated latch of each data hold circuit.

14. A method according to claim 9, further comprising the step of maintaining the output of the flip-flop circuit of each data hold circuit by a time-delay circuit until after the latch circuit assumes a state ready to receive and hold the bit data of the same data hold circuit,
   wherein the step of delaying the operating timing of the flip-flop circuit with respect to the operating timing of the associated latch circuit is accomplished by connecting a clock signal input line having a plurality of bifurcated branch lines connected one to each of the data hold circuits, wherein each of the bifurcated branch lines extends from the clock signal input line to a junction, and is divided at the junction into a first sub-branch portion leading to a control terminal of the flip-flop circuits and a second sub-branch portion leading to a control terminal of the associated latch circuit, wherein the first sub-branch portion is longer than the second sub-branch portion.

15. A method of driving a shift register device, which includes a plurality of series-connected data hold circuits, each having a series set of a flip-flop circuit and an associated latch circuit arranged in the named order which are respectively operable on alternate half-cycles of an input clock signal, comprising:

delaying the input clock signal for operating the flip-flop circuit of each data hold circuit with respect to the input clock signal for operating the latch circuit of the same data hold circuit.

16. A method according to claim 15, further comprising the step of maintaining the output of the flip-flop circuit of each data hold circuit until after the latch circuit assumes a state ready to receive and hold the bit data of the same data hold circuit.

17. A method according to claim 15, further comprising the step of delaying the input timing of the flip-flop circuit of a succeeding data hold circuit with respect to the output timing of the flip-flop circuit of a preceding data hold circuit.

18. A method according to claim 15, wherein the latch circuit of a data hold circuit is rendered to output its holding bit data to the flip-flop circuit of the next series-connected data hold circuit when the input operation of the latch circuit is not delayed with respect to the output operation of the flip-flop circuit within the same data hold circuit.

19. A method according to claim 15, further comprising the step of:

maintaining the output of the flip-flop circuit of each data hold circuit by a time-delay circuit until after the latch circuit assumes a state ready to receive and hold the bit data of the same data hold circuit, wherein the step of delaying the operating timing of the flip-flop circuit is accomplished by connecting a time-delay circuit to each data hold circuit so that each time-delay circuit input is connected to the clock signal input lines and each time-delay circuit output is connected to a control terminal of the flip-flop circuit, and wherein the clock signal input line is connected directly to a control terminal of the associated latch of each data hold circuit.

20. A method according to claim 15, further comprising the step of maintaining the output of the flip-flop circuit of each data hold circuit by a time-delay circuit until after the latch circuit assumes a state ready to receive and hold the bit data of the same data hold circuit, wherein the step of delaying the input clock signal for operating the flip-flop circuit with respect to the input clock signal for operating the associated latch circuit is accomplished by connecting a clock signal input line having a plurality of bifurcated branch lines connected one to each of the data hold circuits, wherein each of the bifurcated branch lines extends from the clock signal input line to a junction, and is divided at the junction into a first sub-branch portion leading to a control terminal of the flip-flop circuits and a second sub-branch portion leading to a control terminal of the associated latch circuit, wherein the first sub-branch portion is longer than the second sub-branch portion.

* * * * *